United States Patent [19]
Matsuura et al.

[11] Patent Number: 5,208,487
[45] Date of Patent: May 4, 1993

[54] RS FLIP-FLOP

[75] Inventors: Yoshinori Matsuura; Shinichi Nakagawa; Tetsuya Matsumura, all of Hyogo, Japan

[73] Assignee: Mitsubishi Denki Kabushiki Kaisha, Tokyo, Japan

[21] Appl. No.: 862,661

[22] Filed: Apr. 1, 1992

[30] Foreign Application Priority Data

Apr. 4, 1991 [JP] Japan ............................. 3-71745

[51] Int. Cl.⁵ .......................... H03K 3/26; H03K 3/29
[52] U.S. Cl. ................................. 307/289; 307/272.1; 307/279
[58] Field of Search ............. 307/289, 279, 291, 272.1

[56] References Cited
U.S. PATENT DOCUMENTS 4,581,548  4/1986  Young ................................. 307/279
4,651,029  3/1987  Oritani ................................ 307/279

Primary Examiner—Jin F. Ng
Assistant Examiner—Sinh Tran
Attorney, Agent, or Firm—Lowe, Price, LeBlanc & Becker

[57] ABSTRACT

A logic circuit outputs a logic signal in response to set inputs and a reset input. This logic signal is applied to output terminals through a latch circuit. When outputs Q and $\overline{Q}$ of the RS flip-flop maintain a previous state, the latch circuit is activated by a control signal applied from an OR gate to hold a previous logic signal received from the logic circuit. Thus, the logic circuit and latch circuit are arranged on a signal path from input terminals to output terminals. These logic circuit and latch circuit do not include a series connection of transistors and, therefore, is operable at high speed in response to the inputs. Consequently, the outputs Q and $\overline{Q}$ have excellent response characteristics relative to the set and reset inputs, to enable a high-speed operation.

13 Claims, 5 Drawing Sheets

FIG. 6         PRIOR ART

| INPUTS | | | OUTPUTS | |
|---|---|---|---|---|
| S1 | S2 | R | Q | $\bar{Q}$ |
| 0 | 0 | 0 | UNCHANGED | |
| 0 | 0 | 1 | 0 | 1 |
| 0 | 1 | 0 | 1 | 0 |
| 0 | 1 | 1 | INDEFINITE | |
| 1 | 0 | 0 | 1 | 0 |
| 1 | 0 | 1 | INDEFINITE | |
| 1 | 1 | 0 | 1 | 0 |
| 1 | 1 | 1 | INDEFINITE | |

1

RS FLIP-FLOP

BACKGROUND OF THE INVENTION

2. Field of the Invention

This invention relates to RS flip-flops (reset-set type flip-flops), and more particularly to an RS flip-flop having a plurality of set inputs.

2. Description of the Background Art

FIG. 4 is a logic gate diagram showing an ordinary construction of a conventional RS flip-flop. In the drawing, the RS flip-flop has a three-input NOR gate 1 and a two-input NOR gate 2. The three-input NOR gate 1 receives a first set input S1 and a second set input S2 through input terminals 3 and 4. The three-input NOR gate 1 also receives an output of the two-input NOR gate 2. The two-input NOR gate 2 receives a reset input R through an input terminal 5. The two-input NOR gate 2 also receives an output of the three-input NOR gate 1. The outputs of the NOR gates 1 and 2 are applied to output terminals 6 and 7, respectively. Complementary memory state signals or output signals $\bar{Q}$ and Q ar obtained from the output terminals 6 and 7.

FIG. 5 is a circuit diagram showing the conventional RS flip-flop in greater detail. In the drawing, the three-input NOR gate 1 has p-channel MOS transistors 11–13 and n-channel MOS transistors 14–16. The p-channel MOS transistors 11–13 are connected in series between a power source VDD and an output node N1. The p-channel MOS transistors 11 and 12 receive the set inputs S1 and S2 at the respective gates thereof. The p-channel MOS transistor 13 receives at the gate thereof the output of the two-input NOR gate 2. The n-channel MOS transistors 14-16 are connected in parallel between the output node N1 and ground GND. The n-channel MOS transistors 14 and 15 receive the set inputs S1 and S2 at the respective gates thereof. The n-channel MOS transistor 16 receives at the gate thereof the output of the two-input NOR gate 2. The output node N1 is connected to the output terminal 6.

On the other hand, the two-input NOR gate 2 has p-channel MOS transistors 21 and 22 and n-channel MOS transistors 23 and 24. The p-channel MOS transistors 21 and 22 are connected in series between a power source VDD and an output node N2. The p-channel MOS transistor 21 receives at the gate thereof the output of the three-input NOR gate 1. The p-channel MOS transistor 22 receives at the gate thereof the reset input R. The n-channel MOS transistors 23 and 24 are connected in parallel between the output node N2 and ground GND. The n-channel MOS transistor 23 receives at the gate thereof the output of the three-input NOR gate 1. The n-channel MOS transistor 24 receives at the gate thereof the reset input R. The output node N2 is connected to the output terminal 7.

FIG. 6 is a diagram showing a relationship between input and output of the RS flip-flop shown in FIGS. 4 and 5. An operation of the conventional RS flip-flop will be described with reference to FIG. 6. In the following description, logic "1" corresponds to H level, and logic "0" to L level.

(1) Case of maintaining state of outputs Q and $\bar{Q}$:

First, a case will be described in which inputs S1=0, S2=0 and R=0 are applied while the RS flip-flop is outputting Q=1 and $\bar{Q}$=0. In this case, the NOR gate 1 receives S1=0, S2=0 and Q=1, whereby the output $\bar{Q}$ of the NOR gate 1 becomes logic "0". The NOR gate 2 receives R=0 and $\bar{Q}$=0, whereby the output Q of the NOR gate 2 becomes logic "1". Thus, the output state will remain unchanged.

Next, a case will be described in which inputs S1=0, S2=0 and R=0 are applied while the RS flip-flop is outputting Q=0 and $\bar{Q}$=1. In this case, the NOR gate 1 receives S1=0, S2=0 and Q=0, whereby the output $\bar{Q}$ of the NOR gate 1 becomes logic "1". The NOR gate 2 receives R=0 and $\bar{Q}$=1, whereby the output Q of the NOR gate 2 becomes logic "0". Thus, the output state will remain unchanged.

In this way, the outputs Q and $\bar{Q}$ maintain a previous state when the reset input R, set input S1 and set input S2 are all logic "0".

(2) Case of resetting RS flip-flop (Q=0 and $\bar{Q}$=1):

First, a case will be described in which inputs S1=0, S2=0 and R=1 are applied when the RS flip-flop is set, i.e. outputting Q=1 and $\bar{Q}$=0. In this case, the NOR gate 1 receives S1=0, S2=0 and Q=1, whereby the output $\bar{Q}$ of the NOR gate 1 becomes logic "1". The NOR gate 2 receives R=1 and $\bar{Q}$=0, whereby the output Q of the NOR gate 2 becomes logic "0". Thus, the outputs Q and $\bar{Q}$ of the RS flip-flop are inverted, which means that the RS flip-flop is reset.

Next, a case will be described in which inputs S1=0, S2=0 and R=1 are applied when the RS flip-flop is reset, i.e. outputting Q=0 and $\bar{Q}$=1. In this case, the NOR gate 1 receives S1=0, S2=0 and Q=0, whereby the output $\bar{Q}$ of the NOR gate 1 becomes logic "1". The NOR gate 2 receives R=1 and $\bar{Q}$=1, whereby the output Q of the NOR gate 2 becomes logic "0". Thus, the outputs Q and $\bar{Q}$ are not inverted and the RS flip-flop maintains the reset state.

(3) Case of setting RS flip-flop (Q=1 and $\bar{Q}$=0):

First, a case will be described in which R=0 is inputted and at least one of the set inputs S1 and S2 is changed to logic "1" when the RS flip-flop is set, i.e. outputting Q=1 and $\bar{Q}$=0. In this case, the NOR gate 1 receives S1=1, S2=0 and Q=1, or S1=1, S2=1 and Q=1, or S1=0, S2=1 and Q=1, whereby the output $\bar{Q}$ of the NOR gate 1 becomes logic "0". The NOR gate 2 receives R=0 and $\bar{Q}$=0, whereby the output Q of the NOR gate 2 becomes logic "1". Thus, the RS flip-flop maintains the set state.

Next, a case will be described in which R=0 is inputted and at least one of the set inputs S1 and S2 is changed to logic "1" when the RS flip-flop is reset, i.e. outputting Q=0 and $\bar{Q}$=1. In this case, the NOR gate 1 receives S1=1, S2=0 and Q=0, or S1=1, S2=1 and Q=0, or S1=0, S2=1 and Q=0, whereby the output $\bar{Q}$ of the NOR gate 1 becomes logic "0". The NOR gate 2 receives R=0 and $\bar{Q}$=0, whereby the output Q of the NOR gate 2 becomes logic "1". Thus, the outputs Q and $\bar{Q}$ are inverted, which means that the RS flip-flop is set.

The conventional RS flip-flop, as shown in FIG. 5, has many transistors 11-13 connected in series between the power source VDD and output node N1. These transistors 11-13 must all be turned on when inverting the output $\bar{Q}$ from logic "0" to logic "1". However, each of the transistors 11-13 is not turned on immediately upon receipt of an L-level signal at the gate thereof; a predetermined delay time is involved in switching from OFF state to ON state. There occurs a corresponding delay in the change in potential of the output $\bar{Q}$. Further, the delay in the potential change of the output $\bar{Q}$ is passed on to the NOR gate 2 to cause a delay in the potential change of the output Q as well. While the RS flip-flop shown in FIG. 5 has two set inputs, a greater number of set inputs will result in an increase in the number of transistors connected in series between the power source VDD and output node N1, hence a longer delay time.

As described above, the conventional RS flip-flop has the disadvantage of poor response characteristics of the outputs Q and $\overline{Q}$ to the set inputs and reset input, which is due to the presence of a series circuit of many transistors between the power source and the output terminal. Thus, it has been difficult to employ such conventional RS flip-flops in an electronic circuit required to operate at high speed.

SUMMARY OF THE INVENTION

The object of this invention, therefore, is to provide an RS flip-flop constantly operable at high speed and having excellent response characteristics regardless of an increase in the number of set inputs.

An RS flip-flop according to this invention is constructed to store first and second logic states in response to a reset input and a plurality of set inputs, and includes a logic circuit, a latch circuit and a control signal generating device. The logic circuit includes set input transistors connected in parallel between a first reference potential source and an output node to be turned on and off in response to the set inputs, respectively, and a reset input transistor disposed between a second reference potential source and the output node to be turned on and off in response to the reset input. The logic circuit has a first mode for outputting a first or a second logic level signal based on a logic combination of the set inputs and reset input, and a second mode for placing the output node in high-impedance state. The latch circuit receives the output signal of the logic circuit. The control signal generating device generates a control signal for controlling the latch circuit in response to the reset input and set inputs. The latch circuit outputs memory state signals.

In this invention, the output signal of the logic circuit is obtained as memory state signals through the latch circuit. The logic circuit includes a plurality of set input transistors connected in parallel between a first reference potential source and an output node, and a reset input transistor disposed between a second reference potential source and the output node. Thus, the RS flip-flop of this invention does not include a series circuit of transistors on an output path of the memory state signals. The memory state signals, therefore, have potentials variable at high speed in response to the reset input and set inputs. That is, the RS flip-flop of this invention has excellent output response to the inputs.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram showing a relationship between input and output in RS flip-flops.

DESCRIPTION OF THE PREFERRED EMBODIMENTS

Figure 1:
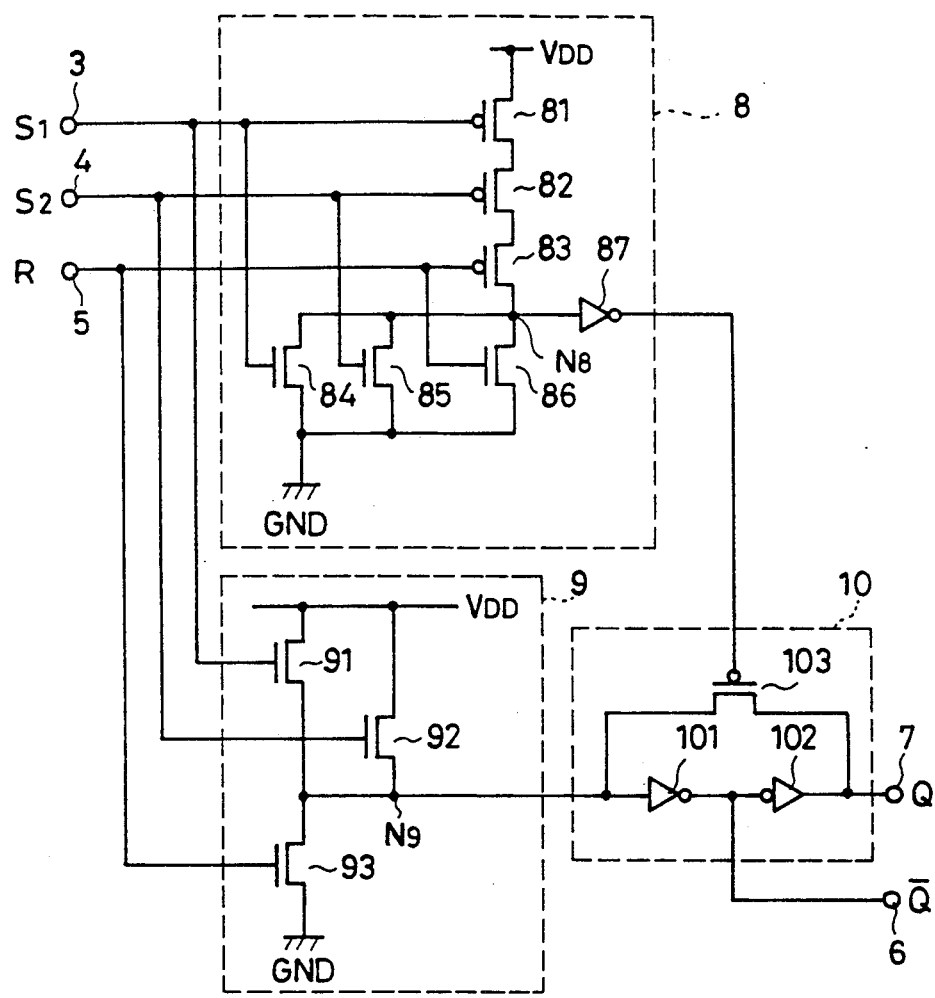
FIG. 1 is a circuit diagram showing an embodiment of this invention.

FIG. 1 is a circuit diagram showing an embodiment of this invention. In the drawing, an RS flip-flop in this embodiment has a three-input OR gate 8, a logic circuit 9 and a latch circuit 10. The three-input OR gate 8 generates a control signal for application to the latch circuit 10, and includes p-channel MOS transistors 81–83, n-channel MOS transistors 84–86, and an inverter 87. The p-channel MOS transistors 81–83 are connected in series between a power source VDD and a node N8. The p-channel MOS transistors 81 and 82 receive set inputs S1 and S2 at the gates thereof through input terminals 3 and 4, respectively. The p-channel MOS transistor 83 receives a reset input R at the gate thereof through an input terminal 5. The n-channel MOS transistors 84–86 are connected in parallel between the node N8 and ground GND. The n-channel MOS transistors 84 and 85 receive the set inputs S1 and S2 at the gates thereof through the input terminals 3 and 4, respectively. The n-channel MOS transistor 86 receives the reset input R at the gate thereof through the input terminal 5. The node N8 is connected to an input of the inverter 87.

The logic circuit 9 includes n-channel MOS transistors 91–93. The n-channel MOS transistors 91 and 92 are connected in parallel between a power source VDD and an output node N9. These n-channel MOS transistors 91 and 92 receive the set inputs S1 and S2 at the gates thereof through the input terminals 3 and 4, respectively. The n-channel MOS transistor 93 receives the reset input R at the gate thereof through the input terminal 5.

Figure 2:
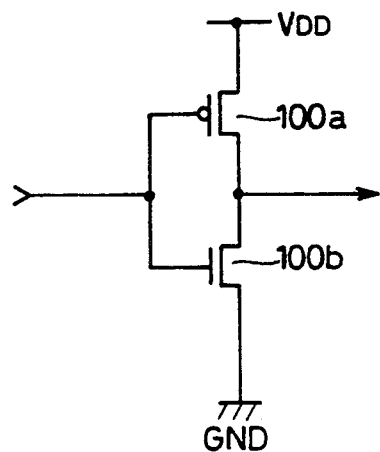
FIG. 2 is a circuit diagram showing an example of construction of an inverter 101 or 102 in FIG. 1.

The latch circuit 10 includes an even number of, e.g. two, inverters 101 and 102, and a p-channel MOS transistor 103. The inverter 101 has an input connected to the output node N9 of the logic circuit 9. The output of the inverter 101 is connected to an input of the inverter 102 and to an output terminal 6. The output of the inverter 102 is connected to an output terminal 7. The p-channel MOS transistor 103 is connected between the input of the inverter 101 and the output of the inverter 102. The p-channel MOS transistor 103 receives the output of the inverter 87 in the three-input OR gate 8. As shown in FIG. 2, the inverter 101 or 102 is constructed as a CMOS inverter including a p-channel MOS transistor 100a and an n-channel MOS transistor 100b.

The RS flip-flop in the embodiment shown in FIG. 1 operates on the set inputs S1 and S2 and reset input R as shown in FIG. 6. The operations of the embodiment shown in FIG. 1 will be described hereinafter. In the following description, logic "1" corresponds to H level, and logic "0" to L level.

(1) Case of maintaining state of outputs Q and $\overline{Q}$ (memory state signals) of RS flip-flop:

First, an operation will be described in which inputs S1=0, S2=0 and R=0 are applied when the RS flip-flop is set or reset. In this case, the transistors 91–93 are all turned off, and the output node N9 becomes high-impedance state. In the OR gate 8, on the other hand, the transistors 81–83 are turned on and the transistors 84-86 turned off. Consequently, a signal of logic "1" is outputted from the node N8. This logic "1" signal is inverted by the inverter 87, and the resulting logic "0"signal is applied to the gate of the transistor 103 in the latch circuit 10. As a result, the transistor 103 is turned on to short-circuit the output of the inverter 102 and the input of the inverter 101. The inverters 101 and 102, therefore, hold the logic of the output signal received from the logic circuit 9 before the output node N9 of the logic circuit 9 becomes high-impedance state. For example, when the output signal of the logic circuit 9 is logic "1"immediately before the output node N9 becomes high-impedance state, the output signal is inverted twice by the inverters 101 and 102 and thereafter returned to the input of the inverter 101. Thus, the latch circuit 10 holds the logic "1"signal as circulating between the inverters 101 and 102. When the output signal of the logic circuit 9 is logic "0"immediately before the output node N9 becomes high-impedance state, the output signal is inverted twice by the inverters 101 and 102 and thereafter returned to the input of the inverter 101. Thus, the latch circuit 10 holds the logic "0"signal as circulating between the inverters 101 and 102.

In this way, the outputs Q and $\overline{Q}$ remain unchanged when inputs S1=0, S2=0 and R=0 are applied to the RS flip-flop in set or reset state.

(2) Case of resetting RS flip-flop (Q=0 and $\overline{Q}$=1):

An operation will be described in which set and reset inputs S1=0, S2=0 and R=1 are applied. In this case, the transistors 91 and 92 are turned off and the transistor 93 turned on. As a result, a logic "0" signal is applied through the output node N9 to the input of the inverter 101 in the latch circuit 10. Thus, output $\overline{Q}$ of logic "1" is obtained from the output terminal 6, and output Q of logic "0"from the output terminal 7. At this time, only the transistors 83 and 86 are in ON state in the OR gate 8, with the other transistors 81, 82, 84 and 85 turned off. Consequently, a logic "0"signal is outputted from the node N8, resulting in a logic "1"signal applied to the gate of the transistor 103 in the latch circuit 10. This places the transistor 103 in OFF state, whereby the latch circuit 10 loses its latching function and acts only as an output driver.

As described above, inputs S1=0, S2=0 and R=1 result in outputs Q=0 and $\overline{Q}$=1 regardless of the previous state of the outputs Q and $\overline{Q}$, thereby resetting the RS flip-flop.

(3) Case of setting RS flip-flop (Q=1 and $\overline{Q}$=0):

An operation will be described in which inputs R=0, S1=1 and S2=0, or R=0, S1=0 and S2=1, or R=0, S1=1 and S2=1 are applied to the RS flip-flop. In this case, the transistor 93 is turned off and at least one of the transistors 91 and 92 turned on in the logic circuit 9. Thus, the signal of logic "1"is applied to the latch circuit 10 through the output node N9. As a result, output $\overline{Q}$ of logic "0"is obtained from the output terminal 6, and output Q of logic "1"from the output terminal 7. In the OR gate 8, the transistors 83 and 86 are turned off and at least one of the transistors 84 and 85 turned on at this time. Consequently, logic "0"is outputted from the node N8, resulting in the signal of logic "1"applied to the gate of the transistor 103 in the latch circuit 10. As a result, the transistor 103 is turned off whereby the latch circuit 10 loses the latching function and acts only as an output driver.

Thus, when the reset input R attains logic "0" and at least one of the set inputs S1 and S2 attains logic "1", outputs Q and $\overline{Q}$ become logic "1"and logic "0", respectively, regardless of the previous state, thereby setting the RS flip-flop.

Figure 3:
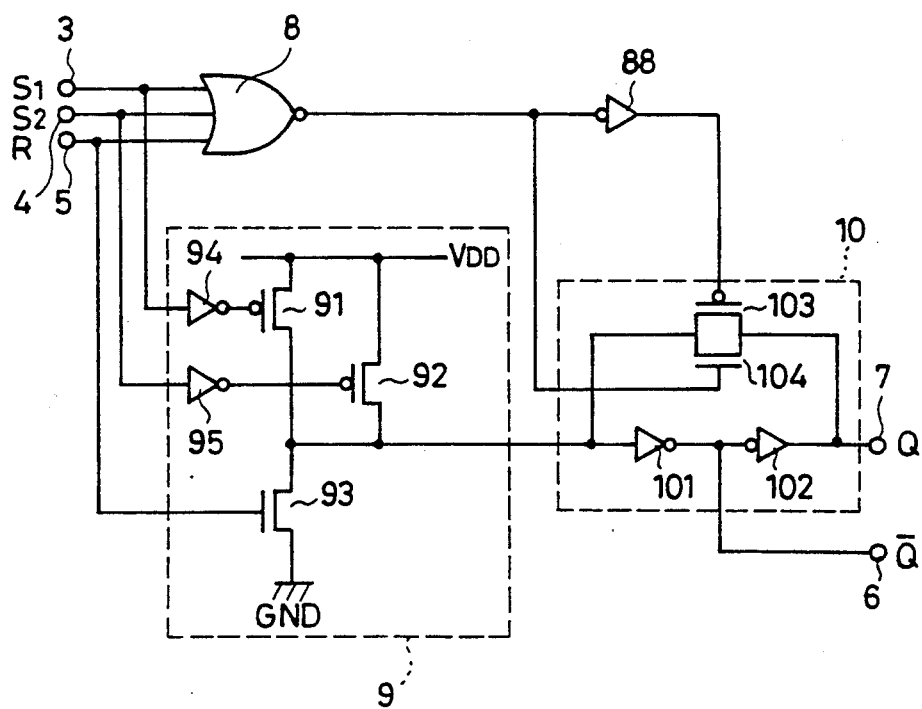
FIG. 3 is a circuit diagram showing another embodiment of this invention.
Figure 4:
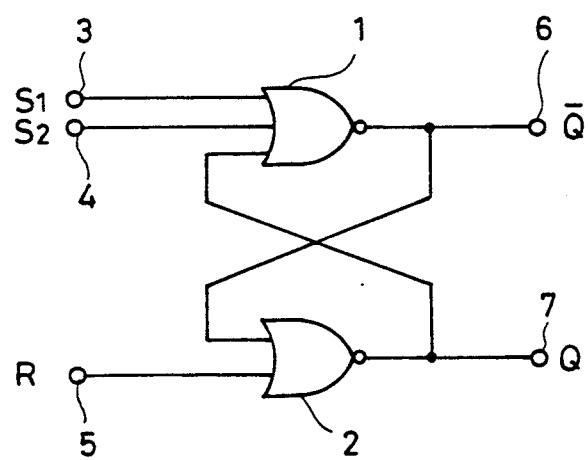
FIG. 4 is a logic gate diagram showing an ordinary construction of a conventional RS flip-flop.

FIG. 3 is a circuit diagram showing an the construction of RS flip-flop in another embodiment of this invention. The embodiment shown in FIG. 3 includes a three-input NOR gate 8' in place of the three-input OR gate 8 in the embodiment shown in FIG. 1. Output of the three-input NOR gate 8' is applied to an n-channel MOS transistor 104 in a latch circuit 10', and through an inverter 88 to the gate of the p-channel MOS transistor 103. These transistors 103 and 104 are connected in parallel between the input of the inverter 101 and the output of the inverter 102. On the other hand, a logic circuit 9' includes p-channel MOS transistors 91, and 92, in place of the n-channel MOS transistors 91 and 92 in FIG. 1. The transistor 91' receives at the gate thereof an inverted signal of set input S1 from an inverter 94. The transistor 92, receives at the gate thereof an inverted signal of set input S2 from an inverter 95. The embodiment shown in FIG. 3 is the same in the other aspects as the embodiment shown in FIG. 1, and like reference numerals are used to identify like elements without repeating their description.

The embodiment shown in FIG. 3 is simply a CMOS version of the embodiment shown in FIG. 1, and is operable in precisely the same way as the latter. Its operation, therefore, will not be described.

Figure 5:
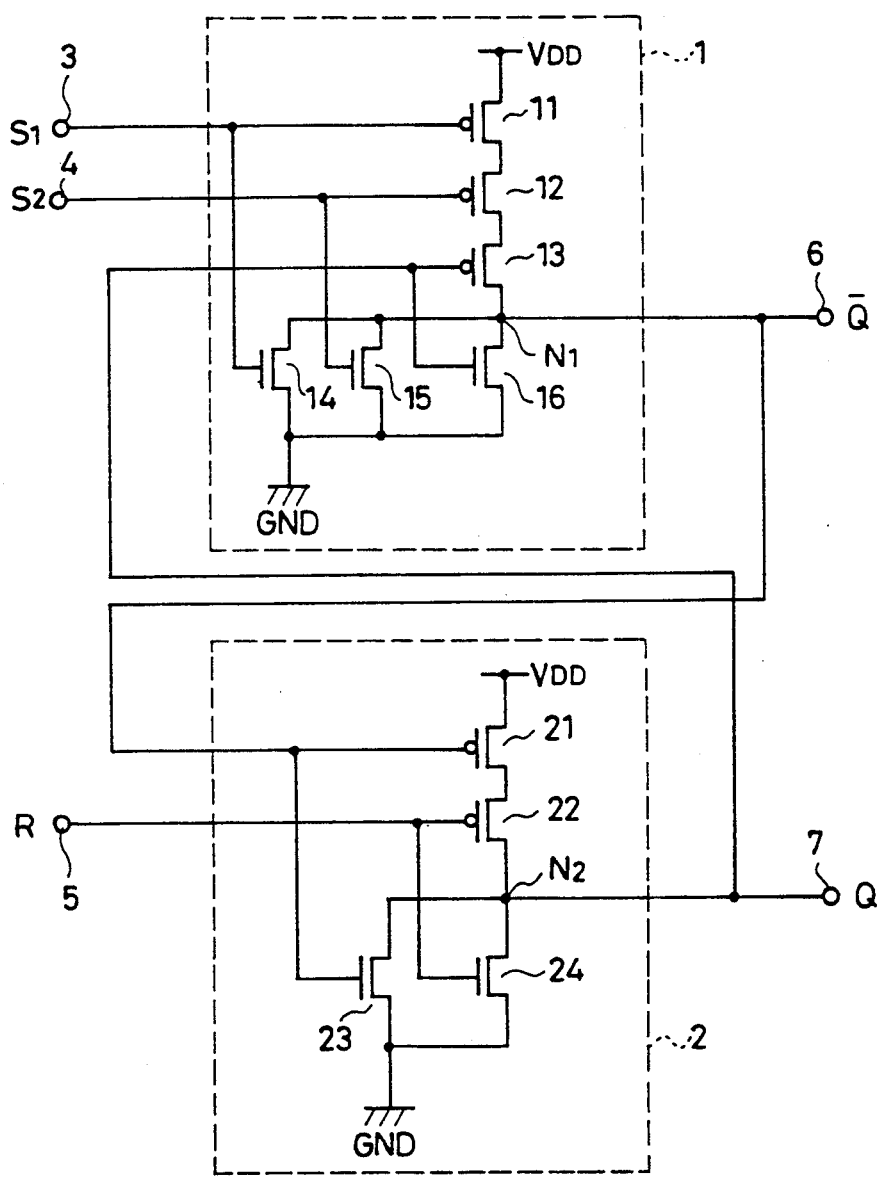
FIG. 5 is a circuit diagram showing the conventional RS flip-flop in greater detail.

In the foregoing embodiments, the output signal of the logic circuit 9 or 9' is applied to the output terminals 6 and 7 through the latch circuit 10 or 10'. Neither the logic circuit 9 or 9' nor the latch circuit 10 or 10' includes transistors connected in series. The reset input and set inputs are, therefore, transmitted at high speed to the output terminals 6 and 7. Consequently, the RS flip-flops in the foregoing embodiments are a significant improvement upon the conventional RS flip-flop shown in FIG. 5 in respect of output response to input.

While two set inputs are used in each of the foregoing embodiments, the number of set inputs may be three or more. An increase in the number of set inputs will not result in a deterioration in the response characteristic since the logic circuit disposed on the output signal path does not include transistors connected in series; only the number of transistors connected in parallel will be increased. Thus, the greater the number of set inputs, the more salient is the advantage of the foregoing embodiments over the conventional RS flip-flop.

As described above, RS flip-flops according to this invention are operable at high speed with a greatly improved output response to inputs compared with the conventional RS flip-flop.

Although the present invention has been described an illustrated in detail, it is clearly understood that the same is by way of illustration and example only and is not to be taken by way of limitation, the spirit and scope of the present invention being limited only by the terms of the appended claims.

What is claimed is:

1. An RS flip flop for storing first and second logic states in response to a reset input and a plurality of set inputs, comprising:

logic circuit means including a plurality of set input transistors electrically connected in parallel to selectively provide respective current paths between a first reference potential source and an output node in response to said set inputs, respectively, and a reset input transistor electrically disposed to selectively provide a current path between a second reference potential source and said output note in response to said reset input, said logic circuit means having a first mode for outputting a first or a second logic level signal based on a logic combination of said set inputs and said reset input, and a second mode for placing said output node in a high-impedance state, latch means for receiving the signal outputted from said logic circuit means, and control signal generating means for generating a control signal to control said latch means in response to said reset input and said set inputs, said latch means outputting memory state signals.

2. An RS flip flop for storing first and second logic states in response to a reset input and a plurality of set inputs, comprising:

logic circuit means including a plurality of set input transistors connected in parallel between a first reference potential source and an output node to be turned on and off in response to said set inputs, respectively, and a reset input transistor disposed between a second reference potential source and said output node to be turned on and off in response to said reset input, said logic circuit means having a first mode for outputting a first or a second logic level signal based on a logic combination of said set inputs and said reset input, and a second mode for placing said output node in a high-impedance state, latch means for receiving the signal outputted from said logic circuit means, and control signal generating means for generating a control signal to control said latch means in response to said reset input and said set inputs, said latch means outputting memory state signals, said latch means being inactivated by said control signal when said logic circuit means is in said first mode, thereby to allow passage intact of the output signal of said logic circuit means, and activated by said control signal when said logic circuit shifts from said first mode to said second mode, thereby to latch an output signal applied from said logic circuit means immediately before.

3. An RS flip-flop according to claim 2, wherein said latch means includes an inverter series circuit having an even number of inverters connected in series, and a transistor for short-circuiting an input and an output connected between an input and an output of said inverter series circuit and turned on and off in response to said control signal.

4. An RS flip-flop according to claim 3, wherein said control signal generating means includes a multi-input OR gate for receiving said reset input and said set inputs.

5. An RS flip-flop according to claim 3, wherein said control signal generating means includes a multi-input NOR gate for receiving said reset input and said set inputs.

6. An RS flip-flop according to claim 1, wherein said latch means includes an inverter series circuit having an even number of inverters connected in series, and a transistor for short-circuiting an input and an output connected between an input and an output of said inverter series circuit and turned on and off in response to said control signal.

7. An RS flip-flop according to claim 1, wherein said control signal generating means includes a multi-input OR gate for receiving said reset input and said set inputs.

8. An RS flip-flop according to claim 1, wherein said control signal generating means includes a multi-input NOR gate for receiving said reset input and said set inputs.

9. An RS flip-flop for storing first and second logic states in response to a reset signal and a plurality of set signals, comprising:

logic circuit means including a plurality of set input transistors connected in parallel to selectively provide current paths between a first reference potential source and an output node to be turned on and off in response to said set signals, respectively, and a reset input transistor connected between a second reference potential source and said output node to be turned on and off in response to said reset signal, said logic circuit means responsive to said set signals and to said reset signal for operation (i) in a first mode for selectively supplying a first or a second logic level output signal in response to a logic combination of said set signals and said reset signal, and (ii) a second mode for operating said output node in a high-impedance state, latch means connected to said output node for receiving the output signal from said logic circuit means, and control signal generating means for generating a control signal to control said latch means in response to said reset signal and said set signals, said latch means outputting memory state signals.

10. An RS flip-flop according to claim 9, wherein said latch means is inactivated by said control signal when said logic circuit means is operated in said first mode, thereby to directly transmit the output signal of said logic circuit means, and activated by said control signal when said logic circuit means transistors from said first mode to said second mode, thereby to latch the output signal supplied by said logic circuit means.

11. An RS flip-flop according to claim 9, wherein said latch means includes an inverter series circuit having an even number of inverters connected in series, and a transistor for short-circuiting an input and an output connected between an input and an output of said inverter series circuit and turned on and off in response to said control signal.

12. An RS flip-flop according to claim 9, wherein said control signal generating means includes a multi-input OR gate for receiving said reset signal and said set signals.

13. An RS flip-flop according to claim 9, wherein said control signal generating means includes a multi-input NOR gate for receiving said reset signal and said set signal.

* * * * *